United States Patent
Meng et al.

(10) Patent No.: US 7,973,308 B2
(45) Date of Patent: Jul. 5, 2011

(54) ORGANIC-SEMICONDUCTOR-BASED INFRARED RECEIVING DEVICE

(75) Inventors: Hsin-Fei Meng, Hsinchu (TW); Sheng-Fu Horng, Hsinchu (TW); Chia-Ming Yang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 152 days.

(21) Appl. No.: 12/385,967

(22) Filed: Apr. 24, 2009

(65) Prior Publication Data

US 2009/0289247 A1    Nov. 26, 2009

(30) Foreign Application Priority Data

May 21, 2008   (TW) .............................. 97118809 A

(51) Int. Cl.
*H01L 29/08* (2006.01)

(52) U.S. Cl. .................. 257/40; 257/184; 257/E51.012; 250/338.4

(58) Field of Classification Search .................... 257/40, 257/184, 431, E51.012, E51.014, E51.017, 257/E51.026; 250/338.4
See application file for complete search history.

(56) References Cited

U.S. PATENT DOCUMENTS

| 5,523,555 A * | 6/1996 | Friend et al. ............. 250/214 R |
| 7,268,363 B2 * | 9/2007 | Lenhard et al. ................. 257/40 |

* cited by examiner

*Primary Examiner* — Mark Prenty
(74) *Attorney, Agent, or Firm* — Oliff & Berridge, PLC

(57) ABSTRACT

An organic-semiconductor-based infrared receiving device comprises an electrode layer having a positive layer and a negative layer to form an electric field, and a transport layer located between the positive and negative layers and having a first and a second predetermined material combined in a predetermined ratio. The energy of infrared light from a light source is received at an interface between the first and second materials. The thickness of the transport layer can be increased to enhance the light absorbance in the infrared light range to form electron-hole pairs, which are then parted to form a plurality of electrons and holes driven by the electric field to move to the negative layer and the positive layer, respectively, so that a predetermined photocurrent is generated.

10 Claims, 6 Drawing Sheets

ORGANIC-SEMICONDUCTOR-BASED INFRARED RECEIVING DEVICE

FIELD OF THE INVENTION

The present invention relates to an organic-semiconductor-based infrared receiving device, and more particularly to an organic-conductive-polymer-based sensing unit capable of converting incident photons into electric current.

BACKGROUND OF THE INVENTION

In recent years, organic semiconductor materials have replaced inorganic semiconductor materials as a working layer material in manufacturing new types of photovoltaic semiconductor elements. Compared to the conventional inorganic semiconductor elements, the organic semiconductor elements have the advantages of being light in weight, flexible, inexpensive, convenient to process, etc. In early stages, the organic semiconductors have energy conversion efficiency as low as 3%. However, the energy conversion efficiency of the organic semiconductors has been upgraded to the range from about 5% to about 10%. The organic semiconductors may be divided into two major types, namely, small-molecule semiconductors and polymer semiconductors. The small-molecule semiconductor elements must be inconveniently manufactured through the vacuum vaporization process. On the other hand, the polymer semiconductor elements may be conveniently and economically manufactured through solution process by way of spin-coating, inject printing, etc. to largely reduce the manufacturing cost of the semiconductor elements.

The traditional photo detector uses an inorganic material as its sensing material. It is expensive and uneasy to manufacture inorganic semiconductors by doping silicon to enable different photo-detecting wavelengths. On the other hand, due to intrinsic properties thereof, the organic semiconductors can only detect lights in the ultraviolet and visible light ranges, and do not respond to light in the infrared range.

It is therefore tried by the inventor to develop an organic-semiconductor-based infrared receiving device, which has a transport layer with increased thickness to enable enhanced light absorbance, so as to increase the excitons formed at an interface between two combined predetermined semiconductor materials of the transport layer and thereby overcome the problem of low light absorbance of organic matters. In the organic-semiconductor-based infrared receiving device of the present invention, organic polymer semiconductors are used to absorb infrared light and generate photocurrent, allowing the infrared receiving device to be applied in the fields of distance sensing, bio-sensing, photo-sensing, etc.

SUMMARY OF THE INVENTION

Therefore, one of objects of the present invention is to provide an organic-semiconductor-based infrared receiving device for receiving and detecting energy in a predetermined wavelength range of infrared light from a light source.

To achieve the above and other objects, the present invention discloses a organic-semiconductor-based infrared receiving device which comprises an electrode layer having a positive electrical layer and a negative electrical layer to form an electric field, and a transport layer being located between the positive and the negative electrical layer and having of a first and a second predetermined semiconductor material combined in a predetermined ratio. At an interface between the first and the second predetermined semiconductor material, energy in a predetermined infrared wavelength range is absorbed to form a plurality of electron-hole pairs, which are then parted into a plurality of electrons and holes. The plurality of electrons and the plurality of holes are driven by the internal electric field to move to the negative electrical layer and the positive electrical layer respectively, so that a predetermined amount of photocurrent is generated.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Exemplary embodiments of the present invention are described herein in the context of a method, system and apparatus for providing an organic-semiconductor-based infrared receiving device.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

Figure 1:
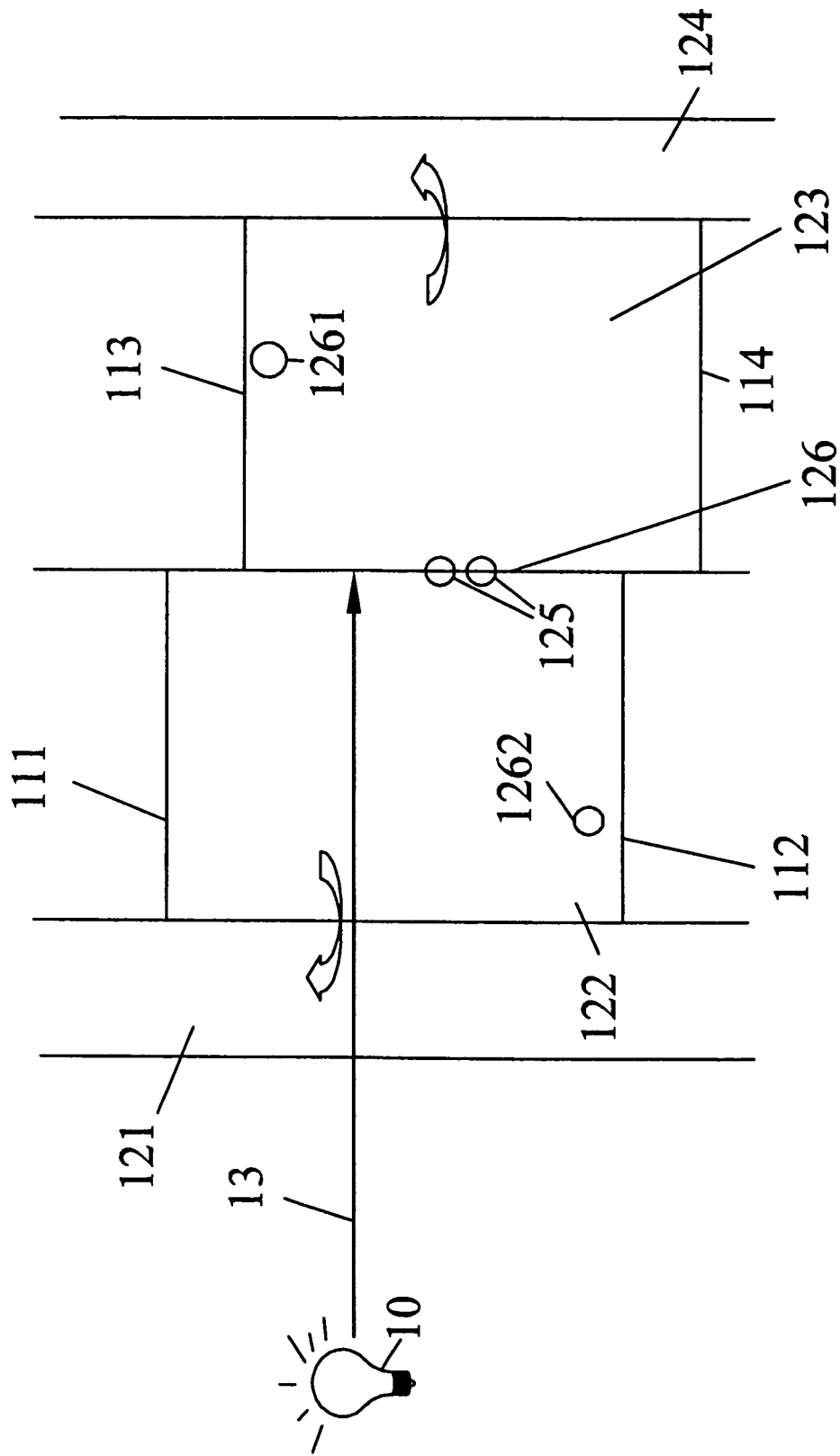
FIG. 1 is a conceptual view showing how the organic-semiconductor-based infrared receiving device of the present invention works.
Figure 5:
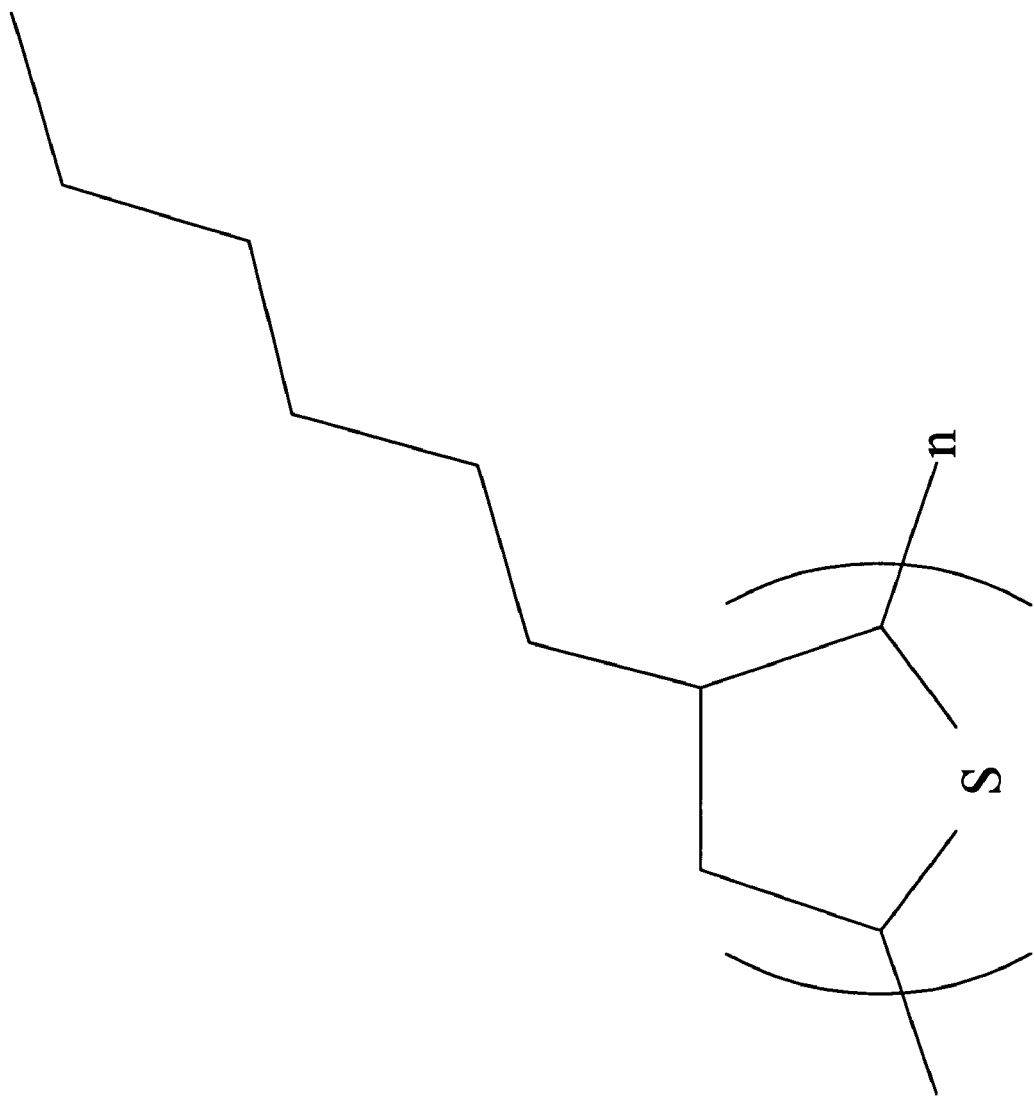
FIG. 5 shows the chemical structure of an organic semiconductor material P3HT used in the present invention.
Figure 6:
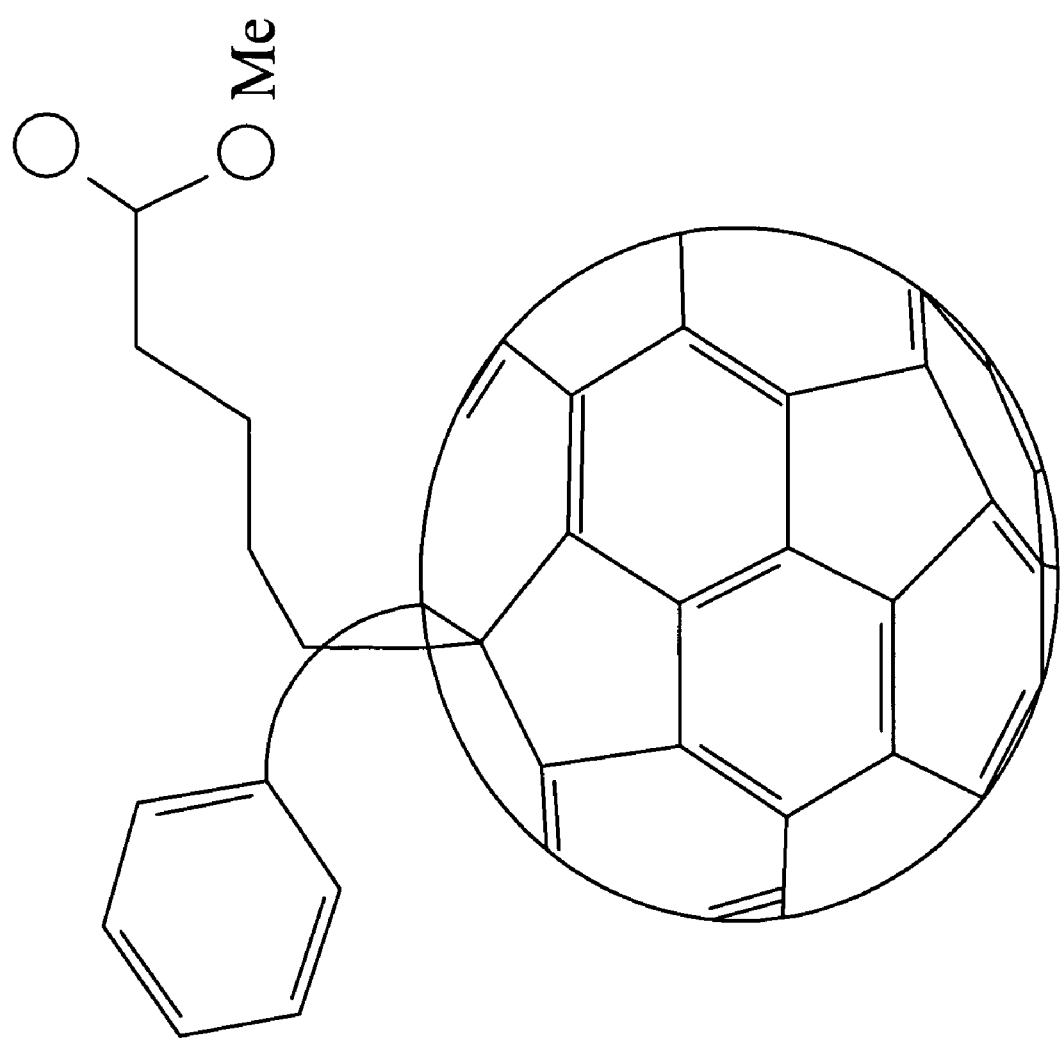
FIG. 6 shows the chemical structure of another organic semiconductor material PCBM used in the present invention.

FIG. 1 illustrates a conceptual view showing how the organic-semiconductor-based infrared receiving device of the present invention works. The organic-semiconductor-based infrared receiving device is configured to receive energy in a predetermined wavelength range of infrared light 13 from a light source 10, and includes a first predetermined semiconductor material 122, which has a lowest unoccupied molecular orbital (LUMO) energy level 111 and a highest occupied molecular orbital (HOMO) energy level 112; and a second predetermined semiconductor material 123, which has a LUMO energy level 113 and a HOMO energy level 114. Preferably, the first predetermined semiconductor material 122 can be P3HT (poly(3-hexylthiophene)), a chemical structure thereof is shown in FIG. 5. The LUMO energy level 111 and the HOMO energy level 112 of the semiconductor material P3HT are about 2.7 and 4.8, respectively. Preferably, the second predetermined semiconductor material 123 is PCBM (6,6-phenyl-C61-butyric Acid Methyl Ester), a chemical structure thereof is shown in FIG. 6. The LUMO energy level 113 and the HOMO energy level 114 of the semiconductor material PCBM are about 3.8 and 6.1, respectively.

The organic-semiconductor-based infrared receiving device of the present invention further comprises an electrode layer having a positive layer 121 and a negative layer 124 to form an electric field, with a negative bias voltage applied between the positive layer 121 and the negative layer 124. A transport layer is located between the positive layer 121 and the negative layer 124, and has the first predetermined semiconductor material 122 and the second predetermined semiconductor material 123, which may be blended in a predetermined ratio, such as 1:1 or any kinds of ratio, such that energy in a predetermined wavelength range of the infrared light 13 is received at a molecular interface 126 between the first and the second predetermined semiconductor material 122, 123. The interface energy gap of the first and second predetermined semiconductor materials 122, 123 absorb photons of the light source 10 to generate a plurality of interface excitons 125, such as electron-hole pairs.

Because of the potential energy difference at the interface between the P3HT 122 and the PCBM 123, the electrons and the holes are parted to generate free electrons 1261 and free holes 1262. The free electrons 1261 and the free holes 1262 are then collected at negative electrode and positive electrode respectively due to a reverse bias, so that the photocurrent is generated. That is, in a photo-induced charge transfer process, holes 1262 formed after light absorbing and excitons separation are collected by a transparent conductive indium tin oxides (ITO) coating of the positive layer 121, and most electrons 1261 are collected by the negative layer 124, which is aluminum or aluminum modified by a metal material with suitable work function. After connecting the infrared receiving device to an external circuit, electric current is generated.

Figure 2:
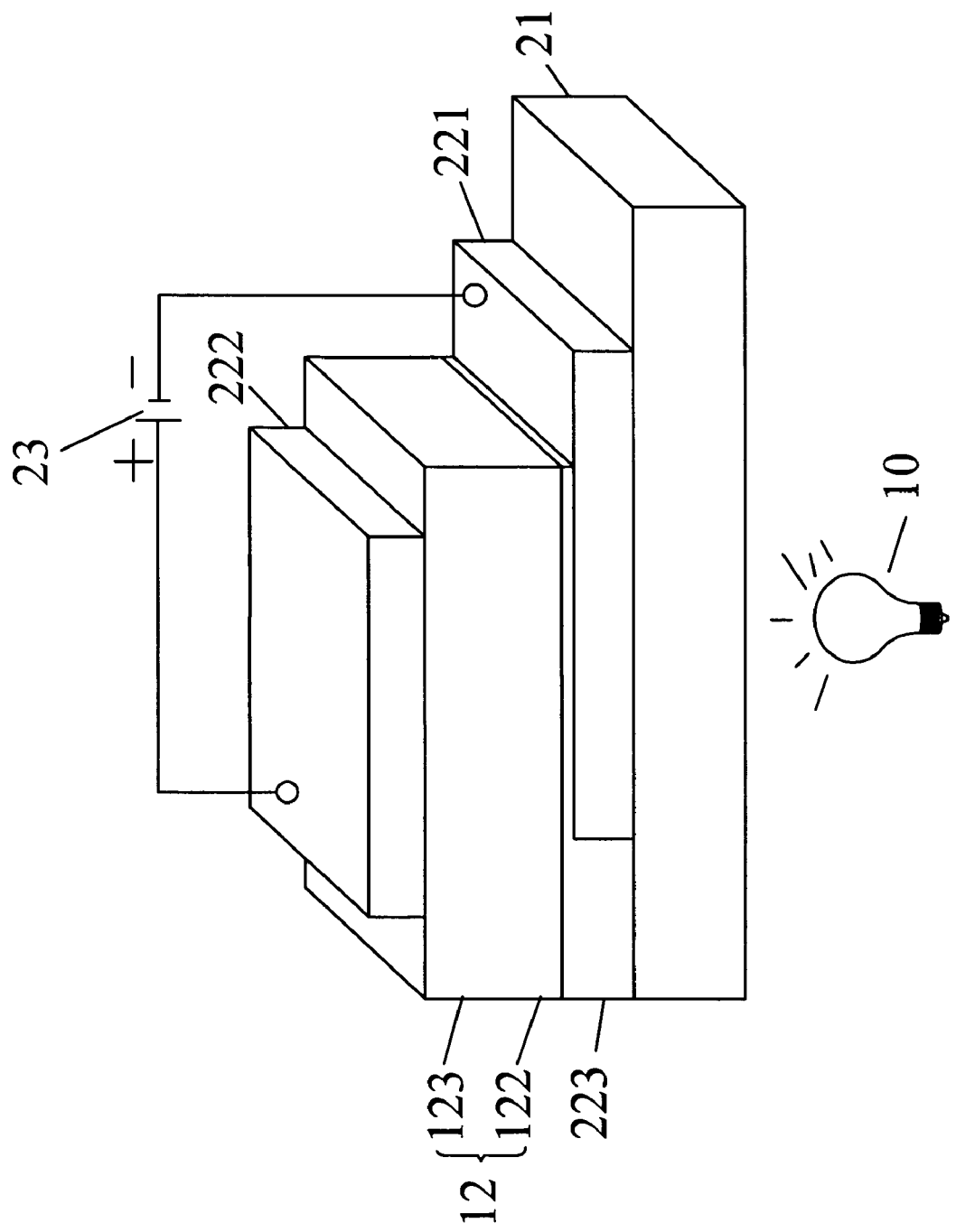
FIG. 2 is a conceptual perspective view of the organic-semiconductor-based infrared receiving device of the present invention.

FIG. 2 illustrates a conceptual perspective view showing the organic-semiconductor-based infrared receiving device of the present invention. The organic-semiconductor-based infrared receiving device comprises an infrared light source 10, a glass substrate 21, a transparent conductive ITO coating 221, a P3HT material 122, a PCBM material 123, a metal 222, a conductive layer 223 and an applied voltage 23. Preferably, the infrared light source 10 can be a point light source or a surface light source, such as a light-emitting diode or a tungsten lamp.

The organic-semiconductor-based infrared receiving device of the present invention can be manufactured through a simple process, such as spin-coating, immersion-coating and inject printing. The P3HT material 122 included in the transport layer 12 is substantially able to absorb visible lights, and the PCBM material 123 also included in the transport layer 12 is substantially able to absorb ultra-violet light. The first and the second predetermined semiconductor material 122, 123 are conductive polymers combined in a predetermined ratio of 1:1, so as to increase a contact area at an interface between the first and the second predetermined semiconductor material 122, 123 and thereby increase the probability of excitons separation.

For conductive polymers, electron-hole pairs subjected to light irradiation move in pairs and are parted at the interface between the two predetermined semiconductor materials 122, 123 of the transport layer 12. Due to different HOMO and LUMO of the two predetermined semiconductor materials 122, 123, the separation probability of parted electron-hole pairs at the interface between the two predetermined semiconductor materials 122, 123 is increased.

After the electron-hole pairs become parted, the parted electrons and holes are transferred in electron acceptor and electron donor, and are finally collected by the negative layer and the positive layer, respectively, at two opposite ends of the transport layer 12. That is, the holes are collected by the transparent conductive ITO coating 221 having high work function, and the electrons are collected by the electrode made of an aluminum metal 222 having low work function. The conductive layer 223 may be PEDOT:PSS or [poly(3,4-ethylenedioxythiophene)-poly(styrene sulfonates)] to increase the conductivity thereof and thereby maintain a clear path for smooth hole transfer, which is an extremely important requirement.

Figure 3:
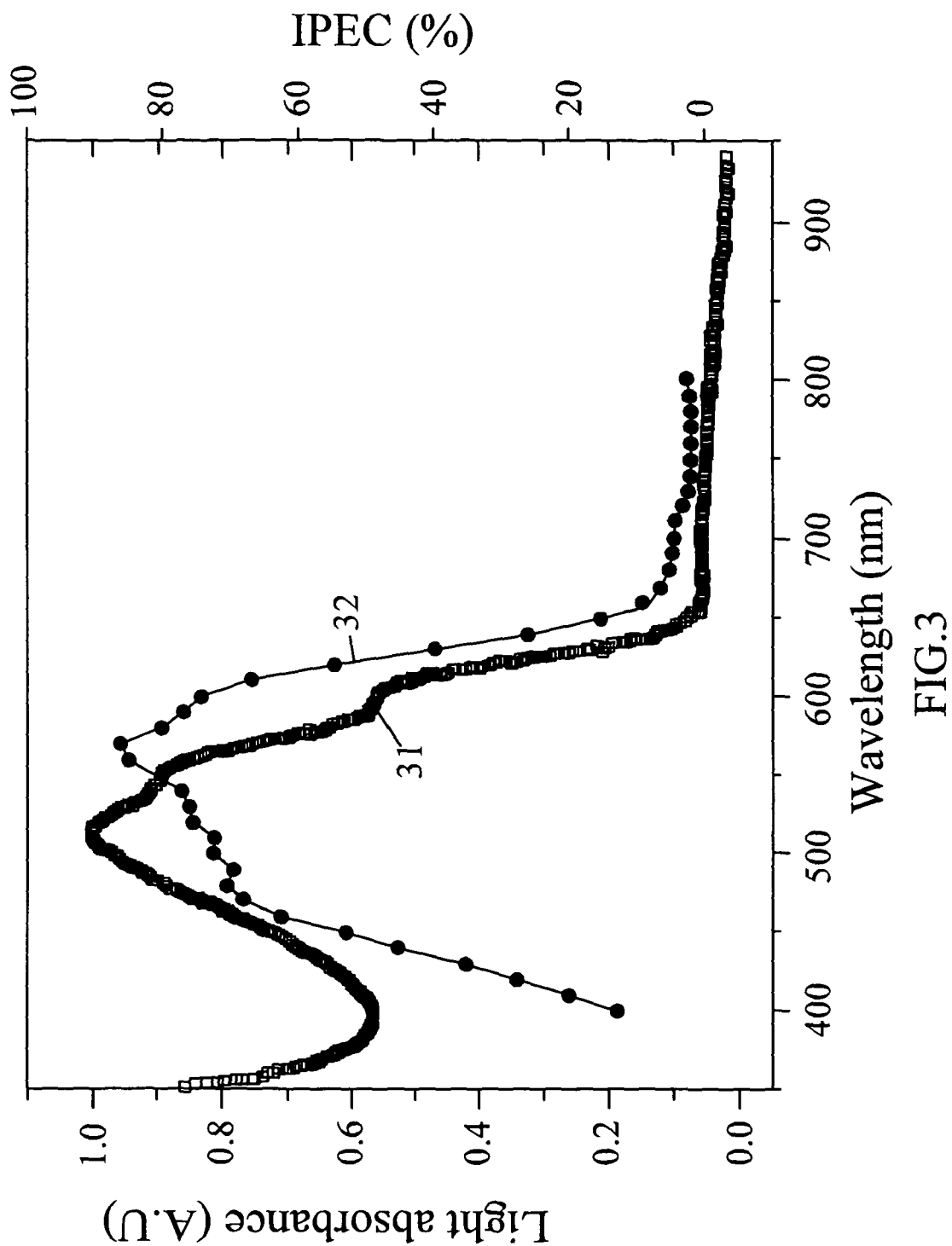
FIG. 3 is a curve diagram showing a light absorbance curve and an IPCE curve measured from an embodiment of the organic-semiconductor-based infrared receiving device of the present invention.

FIG. 3 illustrates a curve diagram showing the light absorbance and the incident photon to current conversion efficiency (IPCE) of the organic-semiconductor-based infrared receiving device of the present invention when the transport layer 12 thereof has a thickness of 200 nm. In FIG. 3, the curve 31 is a light absorbance curve indicating the energy in the visible light wavelength range absorbed by the organic-semiconductor-based infrared receiving device, and the curve 32 is an IPCE curve indicating the incident photon to current conversion efficiency of the organic-semiconductor-based infrared receiving device. When a negative bias voltage of −5V is applied across the transport layer 12 and the transport layer 12 absorbs the energy in a predetermined infrared wavelength range, the IPCE of the organic-semiconductor-based infrared receiving device may be as high as 80%. It should be appreciated by the person of with ordinary skills in the art that the thickness of the transport layer can be adjusted according to the desired light absorbance of the infrared light.

Figure 4:
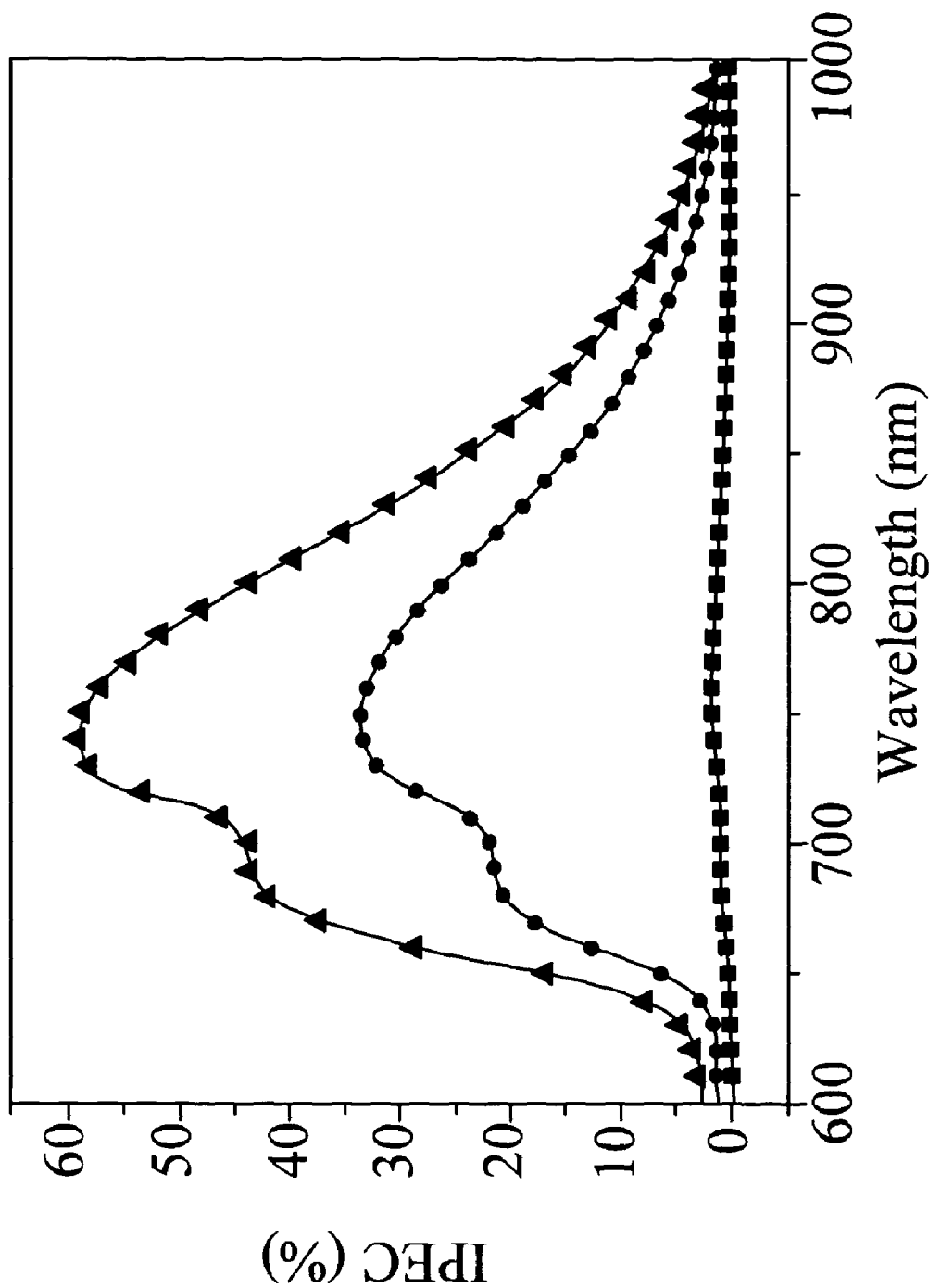
FIG. 4 shows different IPCE curves separately measured from the present invention when different negative bias voltages are applied across the transport layer of the organic-semiconductor-based infrared receiving device.

FIG. 4 illustrates different IPCE curves separately measured from the present invention when the transport layer 12 has a thickness of 14 μm and different negative bias voltages are applied across the transport layer 12. In FIG. 4, the curve 41 indicates the IPCE of the unit in the infrared range when a voltage of 0V is applied; the curve 42 indicates the IPCE of the unit in the infrared range when a negative bias voltage of −100V is applied; and the curve 43 indicates the IPCE of the unit in the infrared range when a negative bias voltage of −200V is applied. As can be seen from FIG. 4, when the applied negative bias voltage is −200V, the IPCE of the unit of the present invention in the infrared range at the wavelength of 750 nm is about 60%, which is much higher compared to the IPCE achieved in the same infrared wavelength range when the applied voltage is 0V. This means the organic-semiconductor-based infrared receiving device of the present invention has a relatively high sensitivity in terms of its IPCE.

In brief, the organic-semiconductor-based infrared receiving device of the present invention has the following advantages:
1. By using conductive organic polymer materials as its semiconductor materials, the device can be more conveniently manufactured.
2. By using the potential energy gap at the interface between the electron acceptor and the electron donor of the conductive organic polymer materials, the device is able to detect light in the infrared wavelength range and form photocurrent.

What is claimed is:
1. An organic-semiconductor-based infrared receiving device for receiving energy in a predetermined wavelength range of infrared light from a light source, comprising:
   an electrode layer having a positive layer and a negative layer to form an electric field; and
   a transport layer being located between the positive layer and the negative layer, and having a first predetermined semiconductor material and a second predetermined semiconductor material combined in a predetermined ratio;

wherein the first and the second predetermined semiconductor material themselves do not absorb infrared wavelength, and the energy in the predetermined infrared wavelength range is received at an interface between the first and the second predetermined semiconductor material to form electron-hole pairs, which are then parted into a plurality of electrons and holes; and wherein the plurality of negative electrons and the plurality of holes are driven by the electric field to move to the negative layer and the positive layer, respectively, so that a predetermined amount of photocurrent is generated.

2. The organic-semiconductor-based infrared receiving device as claimed in claim 1, wherein the light source is a point light source or a surface light source.

3. The organic-semiconductor-based infrared receiving device as claimed in claim 1, wherein the light source is a light emitting diode or a tungsten lamp.

4. The organic-semiconductor-based infrared receiving device as claimed in claim 1, wherein the positive layer is a transparent conductive coating.

5. The organic-semiconductor-based infrared receiving device as claimed in claim 1, wherein the negative layer is a metal material.

6. The organic-semiconductor-based infrared receiving device as claimed in claim 1, wherein the first predetermined semiconductor material is poly(3-hexylthiophene) or P3HT.

7. The organic-semiconductor-based infrared receiving device as claimed in claim 1, wherein the second predetermined semiconductor material is 6, 6-phenyl-C61-butyric acid methyl ester or PCBM.

8. The organic-semiconductor-based infrared receiving device as claimed in claim 1, wherein the first and the second predetermined semiconductor material are combined in any ratio.

9. The organic-semiconductor-based infrared receiving device as claimed in claim 1, wherein the organic-semiconductor-based infrared receiving device is manufactured by a coating process.

10. The organic-semiconductor-based infrared receiving device as claimed in claim 1, wherein thickness of the transport layer can be adjusted according to desired light absorbance of the infrared light.

* * * * *